United States Patent
Yang

(10) Patent No.: US 11,187,940 B2
(45) Date of Patent: Nov. 30, 2021

(54) BACKLIGHT MODULE HAVING A SURFACE LIGHT SOURCE, LIQUID CRYSTAL DISPLAY PANEL AND WELDING METHOD OF LIGHT-EMITTING DIODE CHIP

(71) Applicant: Wuhan China Star Optoelectronics Technology Co., Ltd., Hubei (CN)

(72) Inventor: Yong Yang, Hubei (CN)

(73) Assignee: Wuhan China Star Optoelectronics Technology Co., Ltd., Hubei (CN)

( * ) Notice: Subject to any disclaimer, the term of this patent is extended or adjusted under 35 U.S.C. 154(b) by 286 days.

(21) Appl. No.: 16/604,270

(22) PCT Filed: Apr. 11, 2019

(86) PCT No.: PCT/CN2019/082172
§ 371 (c)(1),
(2) Date: Oct. 10, 2019

(87) PCT Pub. No.: WO2020/107770
PCT Pub. Date: Jun. 4, 2020

(65) Prior Publication Data
US 2021/0333635 A1    Oct. 28, 2021

(30) Foreign Application Priority Data

Nov. 28, 2018 (CN) .......................... 201811436592.6

(51) Int. Cl.
*G02F 1/13357* (2006.01)
*H01L 33/62* (2010.01)

(52) U.S. Cl.
CPC ........ *G02F 1/133603* (2013.01); *H01L 33/62* (2013.01); *H01L 2933/0066* (2013.01)

(58) Field of Classification Search
CPC .............. G09G 3/32; G09G 2300/0426; G02F 1/133603
See application file for complete search history.

(56) References Cited

U.S. PATENT DOCUMENTS

2006/0063351 A1* 3/2006 Jain ..................... H01L 21/6835
                                                      438/455
2017/0171960 A1* 6/2017 Yang .................... H04M 1/0277
2020/0261994 A1* 8/2020 Yang ....................... H01L 33/62

* cited by examiner

*Primary Examiner* — Andrew J Coughlin
(74) *Attorney, Agent, or Firm* — Taft Stettinius & Hollister LLP

(57) ABSTRACT

A backlight module having a surface light source, a liquid crystal display panel, and a welding method of a light-emitting diode chip are provided. The backlight module having a surface light source including: a first pad and a second pad disposed on a substrate; a plurality of pad holes disposed in the first pad and the second pad; a magnetic film layer disposed in the plurality of pad holes; a solder paste disposed both on the first pad and the second pad; a light-emitting diode chip, wherein a plurality of pins disposed on two sides of the light-emitting diode chip are absorbed on the magnetic film layer and are connected to both the first pad and the second pad respectively by the solder paste.

10 Claims, 3 Drawing Sheets

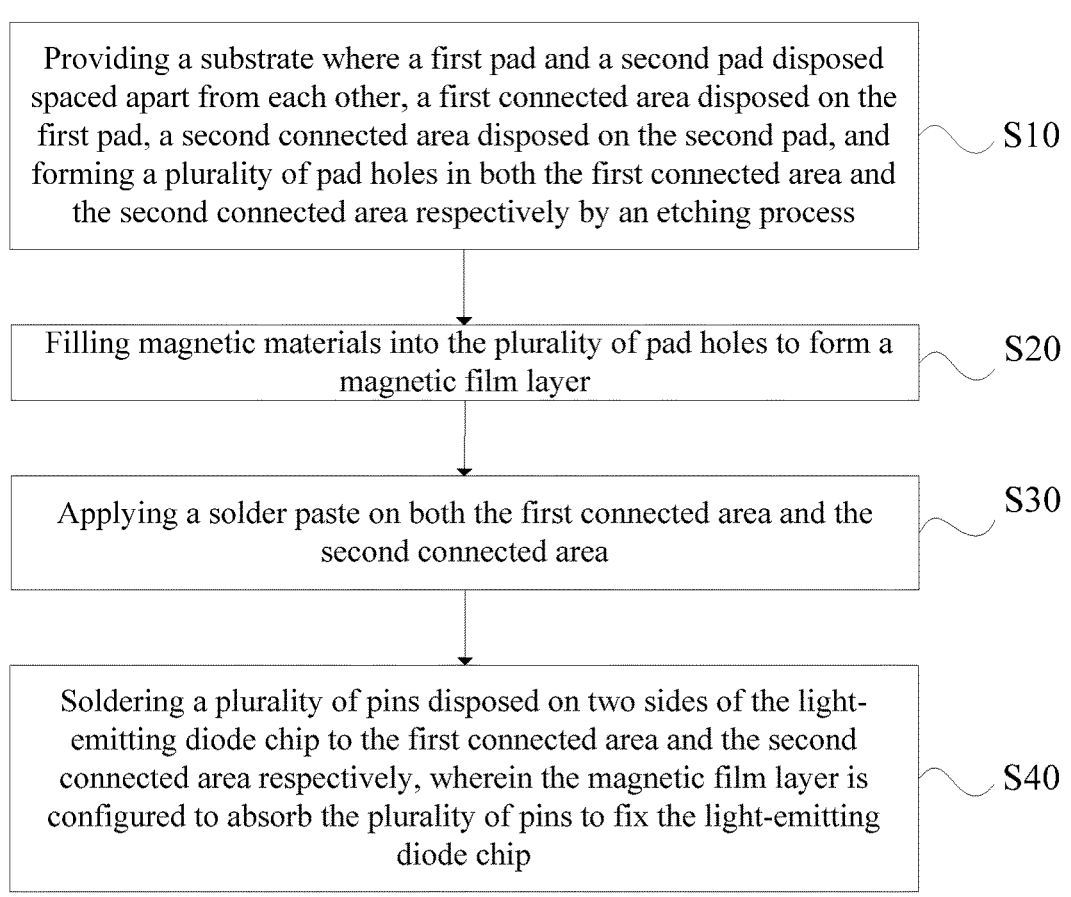
FIG. 3
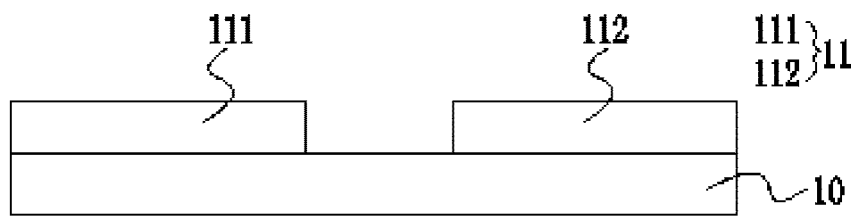
FIG. 4A
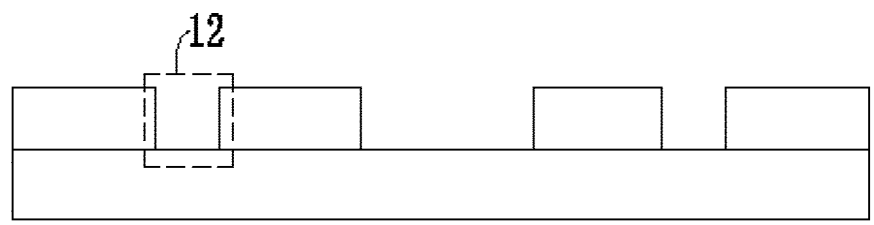

FIG. 4B
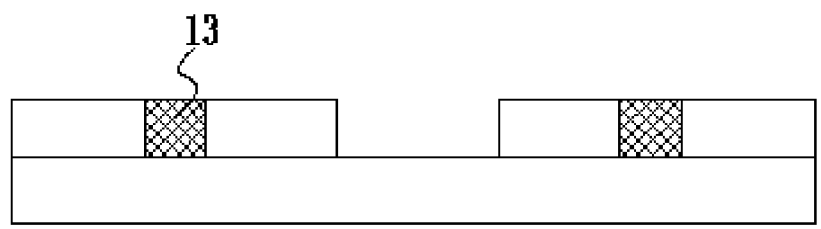
FIG. 4C
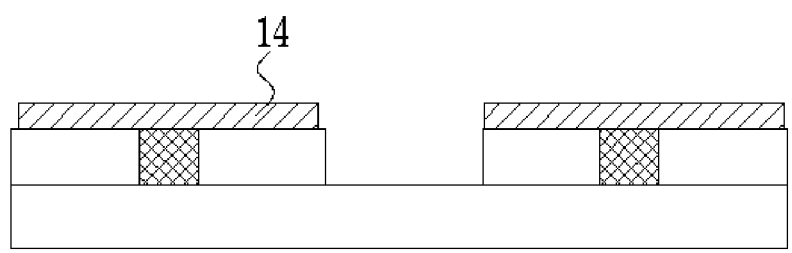
FIG. 4D
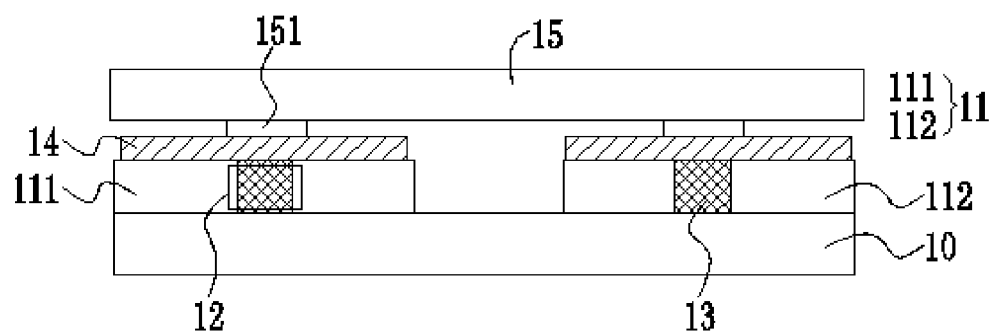
FIG. 4E

BACKLIGHT MODULE HAVING A SURFACE LIGHT SOURCE, LIQUID CRYSTAL DISPLAY PANEL AND WELDING METHOD OF LIGHT-EMITTING DIODE CHIP

CROSS-REFERENCE TO RELATED APPLICATIONS

This application is a U.S. National Phase of International PCT Application No. PCT/CN2019/082172 filed Apr. 11, 2019, which claims the benefit of Chinese Patent Application Serial No. 201811436592.6 filed Nov. 28, 2018, the contents of each application are incorporated herein by reference in their entirety.

BACKGROUND

1. Field of Invention

The present disclosure relates to the field of display technology, and more particularly to a backlight module having a surface light source, a liquid crystal display panel, and a welding method of light-emitting diode chip.

2. Description of the Prior Art

Mini light-emitting diodes, having surface light sources, is a hot project being developed in the market. However, lights of the surface light sources are more diffused resulting in a lower luminous efficiency, because light-emitting diode chips used are smaller. At the same time, a substrate design during a solid crystal process also has a great influence on a light emergent uniformity of the surface light source. A flip chip needs to connect a chip pad and a substrate pad by a solder paste to conduct electricity in the solid crystal process. A processing step of reflow soldering in the solder paste solid easily causes the chip to be pulled and tilted, thereby changing illumination angle of the chip, and causing a problem of partial or large-area uneven lights mixing. A light angle of the chip is being increased to remedy in response to this phenomenon, but this method will cause a reduction of light efficiency.

Therefore, present technology has drawbacks and is in urgent need of improvement.

SUMMARY

The backlight module having a surface light source, the liquid crystal display panel, and the welding method of the light-emitting diode chip can prevent the light-emitting diode chip being pushed and tilted by the solder paste during the solid crystal process and the reflow soldering operation and can ensure solid crystal stability of the light-emitting diode chip and alignment uniformity, thereby improving lights mixing uniformity of the backlight module having the surface light source.

The present disclosure provides a backlight module having a surface light source for a liquid crystal display panel, including:

a substrate;

a first pad disposed on the substrate;

a second pad disposed on the substrate spaced apart from the first pad;

a plurality of pad holes disposed in the first pad and the second pad respectively;

a magnetic film layer corresponding to the plurality of pad holes disposed in the plurality of pad holes;

a solder paste disposed both on the first pad and the second pad;

a light-emitting diode chip, wherein a plurality of pins disposed on two sides of the light-emitting diode chip are corresponding to the magnetic film layer and are connected to both the first pad and the second pad respectively by the solder paste;

wherein the magnetic film layer is configured to absorb the plurality of pins to fix the light-emitting diode chip.

According to the present disclosure of the backlight module having the surface light source, a first connected area is disposed on the first pad, and a second connected area is disposed on the second pad, and the plurality of pins disposed on two sides of the light-emitting diode chip are connected to both the first connected area and the second connected area respectively.

According to the present disclosure of the backlight module having the surface light source, the plurality of pad holes are disposed in both the first connected area and the second connected area.

According to the present disclosure of the backlight module having the surface light source, a size of each of the plurality of the pad hole is 20% to 80% of an area of a corresponding area of the plurality of pins.

According to the present disclosure of the backlight module having the surface light source, a shape of the pad holes each is the same with a shape of the corresponding area of the plurality of pins.

According to the present disclosure of the backlight module having the surface light source, a height of the magnetic film layer is equal to a depth of the pad hole.

According to the present disclosure of the backlight module having the surface light source, the backlight module further includes a white oil layer, wherein the white oil layer is disposed on the substrate, the first pad, and the second pad; and a window opening area, configured to expose the light-emitting diode chip, is disposed on the white oil layer.

The present disclosure provides a liquid crystal display panel, including the backlight module having the surface light source for the liquid crystal display panel as claimed on the above.

The present disclosure provides a welding method of a light-emitting diode chip, the light-emitting diode chip configured to be used in a backlight module having a surface light source, wherein the method includes following steps:

step S10, providing a substrate where a first pad and a second pad disposed spaced apart from each other, a first connected area disposed on the first pad, a second connected area disposed on the second pad, and forming a plurality of pad holes in both the first connected area and the second connected area respectively by an etching process;

step S20, filling magnetic materials into the plurality of pad holes to form a magnetic film layer;

step S30, applying a solder paste on both the first connected area and the second connected area;

step S40, soldering a plurality of pins disposed on two sides of the light-emitting diode chip to the first connected area and the second connected area respectively, wherein the magnetic film layer is configured to absorb the plurality of pins to fix the light-emitting diode chip.

According to the present disclosure of the welding method, a size of each of the plurality of the pad hole is 20% to 80% of an area of a corresponding area of the plurality of pins, and a height of the magnetic film layer is equal to a depth of the pad hole.

Beneficial effects of the present disclosure are that: compared with the existing backlight module having a surface light source, liquid crystal display panel, and welding method of the light-emitting diode chip, the backlight module having a surface light source, the liquid crystal display panel, and the welding method of the light-emitting diode chip as disclosed in the present disclosure can prevent the light-emitting diode chip being pushed and tilted by the solder paste during the solid crystal process and the reflow soldering operation and can ensure solid crystal stability of the light-emitting diode chip and alignment uniformity, thereby improving lights mixing uniformity of the backlight module having the surface light source.

BRIEF DESCRIPTION OF DRAWINGS

In order to more clearly illustrate the technical solution in the present disclosure or in the prior art, the following will illustrate the figures used for describing the embodiments or the prior art. It is obvious that the following figures are only some embodiments of the present disclosure. For a person of ordinary skill in the art, without creative effort, other figures can also be obtained according to these figures.

FIG. 3 is flowchart diagram of a welding method of a light-emitting diode chip according to an embodiment of the present disclosure.

FIG. 4A to 4E are soldering schematic diagrams of a light-emitting diode chip according to an embodiment of the present disclosure.

DETAILED DESCRIPTION OF PREFERRED EMBODIMENTS

Figure 1:
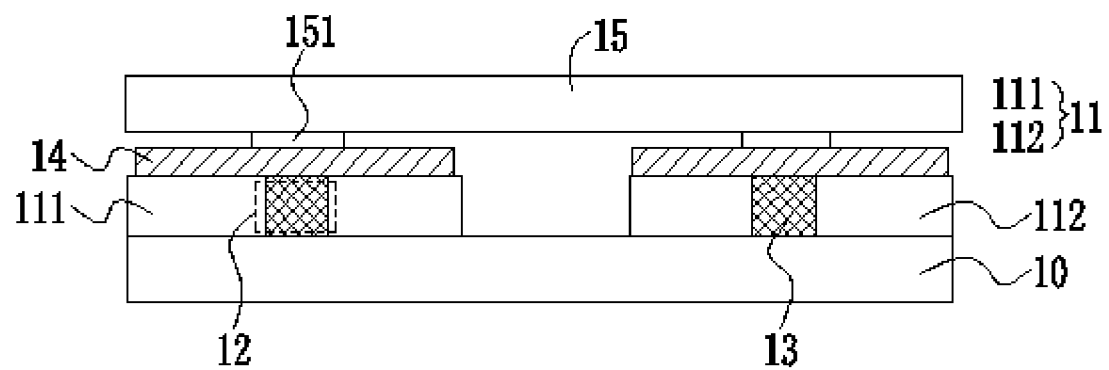
FIG. 1 is a profile schematic diagram of a backlight module having a surface light source according to an embodiment of the present disclosure.

The following description of each embodiment with reference to the accompanying drawings is used to exemplify a specific embodiment which may be carried out in the present disclosure. Directional terms mentioned in the present disclosure, such as "top", "bottom", "front", "back", "left", "right", "inside", "outside", "side" etc., are only used with reference to the orientation of the accompanying drawings. Therefore, the used directional terms are intended to illustrate, but not to limit, the present disclosure. In the accompanying drawings, the identical reference numerals denote the similar elements.

For existing backlight module having a surface light source, the light-emitting diode chip is easy being pushed and tilted by the solder paste during the solid crystal process and the reflow soldering operation, thereby causing solid crystal stability of the light-emitting diode chip and alignment uniformity, thereby improving lights mixing uniformity of the backlight module having the surface light source. The present disclosure can solve the drawback above.

As shown in FIG. 1, FIG. 1 is a profile schematic diagram of a backlight module having a surface light source according to an embodiment of the present disclosure. The backlight module having the surface light source is configured to be applied to a liquid crystal display panel. The liquid crystal display panel includes a substrate 10, a plurality of pads 11, a plurality of pad holes 12, a magnetic film layer 13, a solder paste 14, and a light-emitting diode chip 15. The substrate 10 can be used in a flexible circuit board or a printed circuit board of the backlight module having the surface light source. The plurality of pads 11 are disposed on the substrate 10 on array. The plurality of pads 11 at least include a first pad 111 and a second pad 112 disposed on the substrate spaced apart from each other. The plurality of pad holes 12 are disposed in the first pad 111 and the second pad 112 respectively. The plurality of pad holes 12 can run throughout part or all the plurality of pads 11. The magnetic film layer 13 corresponding to the plurality of pad holes 12 are disposed in the plurality of pad holes 12. Preferably, a height of the magnetic film layer 13 is equal to a depth of the pad hole 12. That is, the magnetic film layer 13 fills the pad hole 12. Materials of the magnetic film layer 13 includes magnetic materials. The solder paste 14 are disposed both on the first pad 111 and the second pad 12. A plurality of pins disposed on two sides of the light-emitting diode chip 15 are corresponding to the magnetic film layer 13 and are connected to both the first pad 111 and the second pad 112 respectively by the solder paste 14. The light-emitting diode chip 15 can be prevented from being pushed and tilted by the solder paste 14 during the solid crystal process and the reflow soldering operation, and solid crystal stability and alignment uniformity of the light-emitting diode chip can be ensured, because the magnetic film layer is configured to absorb the plurality of pins to fix the light-emitting diode chip, thereby improving lights mixing uniformity of the backlight module having the surface light source.

A size of each of the plurality of the pad hole 12 is 20% to 80% of an area of a corresponding area of the plurality of pins 151. Preferably, the size of each of the plurality of the pad hole 12 is 60% to 80% of the area of a corresponding area of the plurality of pins 151.

According to an embodiment, a shape of the pad holes 12 each is the same with a shape of the corresponding area of the plurality of pins 151.

The substrate 10 is a supporting substrate of the backlight module having the surface light source, and generally includes a polyimide (PI) film. A thickness thereof is usually 0.1 mm to 0.12 mm (including white oil). A copper wire (not labeled) and a structure of the pad 11 are attached on the substrate 10. A thickness of the copper wire is 10 um to 15 um. A thickness of the solder paste 14 disposed on the pad 11 is 5 um to 8 um in practical process. A fluorescent film (not shown) is entirely encapsulated on the light-emitting diode chip 15. The fluorescent film is adhered on the light-emitting diode chip 15 and the substrate 10 by a hot-pressing process, and has a thickness of 200 um to 300 um.

Figure 2:
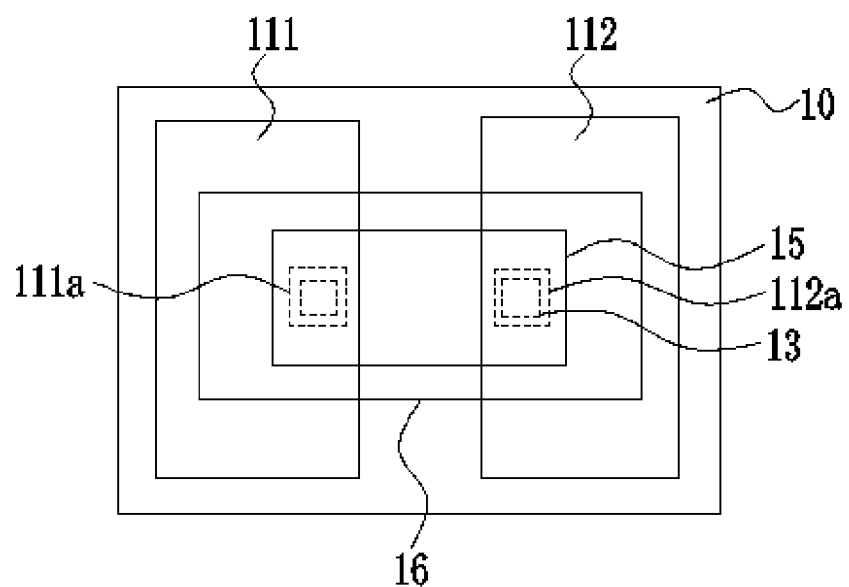
FIG. 2 is a top view schematic diagram of a backlight module having a surface light source according to an embodiment of the present disclosure.

Combining with FIG. 2, FIG. 2 is a top view schematic diagram of a backlight module having a surface light source according to an embodiment of the present disclosure. A first pad 111 and a second pad 112 are disposed on the substrate 10. A white oil layer (not shown) is disposed on the substrate 10, the first pad 111, and the second pad 112, and the white oil layer is set up with a window opening area 16 exposing the light-emitting diode chip 15. A first connected area 111a is disposed on the first pad 111, and a second connected area 112a is disposed on the second pad 112. The plurality of pins are connected to both the first connected area 111a and the second connected area 112a respectively. The plurality of pad holes are disposed in both the first connected area 111a and the second connected area 112a.

According to an embodiment, an area of a corresponding area of the plurality of pins is equal to an area of the first connected area 111a or the second connected area 112a. The magnetic film layer 13 filling the pad hole can generate magnetic attraction to the plurality of pins of the light-emitting diode chip 15. A size of the light-emitting diode chip 15 is 100 um to 500 um. Materials of the plurality of pins of the light-emitting diode chip 15 includes a nickel-gold alloy, and a nickel metal component accounts for 50% to 80%. A thickness of the plurality of pins thickened is 10 um to 20 um, and is about 80% higher than a thickness of a conventional light-emitting diode chip.

The present disclosure is intended to fill the magnetic film layer 13 on the plurality of pads 11, and make the plurality of pins of the light-emitting diode chip 15 are disposed on the magnetic film layer 13 disposed on the plurality of pads 11, ensuring that the light-emitting diode chip 15 is better absorbed and fixed, and preventing from being pushed and tilted the solder paste during the reflow soldering operation, thereby improving lights mixing uniformity of the backlight module having the surface light source.

The present disclosure also provides a liquid crystal display panel including the backlight module having the surface light source above.

The present disclosure also provides a welding method of the light-emitting diode chip. The light-emitting diode chip is configured to be applied to the backlight module having the surface light source. As shown in FIG. 3, the method including following steps:

Step S10. Providing a substrate where a first pad and a second pad disposed spaced apart from each other, a first connected area disposed on the first pad, a second connected area disposed on the second pad, and forming a plurality of pad holes in both the first connected area and the second connected area respectively by an etching process.

Combining with FIG. 4A to FIG. 4B, a plurality of pads 11 are disposed on the substrate 10. The plurality of pads 11 at least include the first pad 111 and the second pad 112 spaced apart from each other. The plurality of pad holes 12 having a specific size and shape is formed by a wet etching process on the pad 11 disposed on the substrate 10. The size and shape of the plurality of pad holes 12 are determined according to a size and shape of the light-emitting diode chip having a solid crystal process.

Step S20. Filling magnetic materials into the plurality of pad holes to form a magnetic film layer.

Combining with FIG. 4C, filling the magnetic materials into the plurality of pad holes 12 to form the magnetic film layer 13 by spraying or brushing. According to an embodiment, a height of the magnetic film layer 13 is equal to a depth of the pad hole 12.

Step S30. Applying a solder paste on both the first connected area and the second connected area.

Combining with FIG. 4D, the solder paste 14 are disposed on both the first pad 111 and the second pad 112, and the solder paste 14 at least covers the first connected area and the second connected area.

Step S40. Soldering a plurality of pins disposed on two sides of the light-emitting diode chip to the first connected area and the second connected area respectively, wherein the magnetic film layer is configured to absorb the plurality of pins to fix the light-emitting diode chip.

Combining with FIG. 4E, doing a solid crystal process, and soldering the plurality of pins 151 disposed on two sides of the light-emitting diode chip 15 to the first connected area and the second connected area respectively by the solder paste 14. When the plurality of pins 151 of the light-emitting diode chip 15 is disposed over the pad 11, the plurality of pins 151 and the magnetic film layer 13 are mutually attracted by a magnetic force because the magnetic film layer 13 is disposed, and a tilting short circuit phenomenon of the light-emitting diode chip 15 during a subsequent reflow soldering operation is prevented.

According to an embodiment, a size of each of the plurality of the pad hole 12 is 20% to 80% of an area of a corresponding area of the plurality of pins 151. A height of the magnetic film layer 13 is equal to a depth of the pad hole 12.

The backlight module having a surface light source, the liquid crystal display panel, and the welding method of the light-emitting diode chip provided in the present disclosure can prevent the light-emitting diode chip being pushed and tilted by the solder paste during the solid crystal process and the reflow soldering operation and can ensure solid crystal stability of the light-emitting diode chip and alignment uniformity, thereby improving lights mixing uniformity of the backlight module having the surface light source.

The present disclosure is described in detail in accordance with the above contents with the specific preferred examples. However, this present disclosure is not limited to the specific examples. For a person of ordinary skill in the art, on the premise of keeping the conception of the present disclosure, the technical personnel can also make simple deductions or replacements, all of which should be considered to belong to the protection scope of the present disclosure.

What is claimed is:

1. A backlight module having a surface light source for a liquid crystal display panel, comprising:
    a substrate;
    a first pad disposed on the substrate;
    a second pad disposed on the substrate spaced apart from the first pad;
    a plurality of pad holes disposed in the first pad and the second pad respectively;
    a magnetic film layer corresponding to the plurality of pad holes disposed in the plurality of pad holes;
    a solder paste disposed both on the first pad and the second pad;
    a light-emitting diode chip, wherein a plurality of pins disposed on two sides of the light-emitting diode chip are corresponding to the magnetic film layer and are connected to both the first pad and the second pad respectively by the solder paste;
    wherein the magnetic film layer is configured to absorb the plurality of pins to fix the light-emitting diode chip.

2. The backlight module having the surface light source as claimed in the claim 1, wherein a first connected area is disposed on the first pad, and a second connected area is disposed on the second pad, and the plurality of pins disposed on two sides of the light-emitting diode chip are connected to both the first connected area and the second connected area respectively.

3. The backlight module having the surface light source as claimed in the claim 2, wherein the plurality of pad holes are disposed in both the first connected area and the second connected area.

4. The backlight module having the surface light source as claimed in the claim 3, wherein a size of each of the plurality of the pad hole is 20% to 80% of an area of a corresponding area of the plurality of pins.

5. The backlight module having the surface light source claimed in the claim 1, wherein a shape of the pad holes each is the same with a shape of the corresponding area of the plurality of pins.

6. The backlight module having the surface light source as claimed in the claim 1, wherein a height of the magnetic film layer is equal to a depth of the pad hole.

7. The backlight module having the surface light source as claimed in the claim 1, wherein the backlight module further comprises a white oil layer, wherein the white oil layer is disposed on the substrate, the first pad, and the second pad; and a window opening area, configured to expose the light-emitting diode chip, is disposed on the white oil layer.

8. A liquid crystal display panel, comprising the backlight module having the surface light source for the liquid crystal display panel as claimed in claim 1.

9. A welding method of a light-emitting diode chip, the light-emitting diode chip configured to be used in a backlight module having a surface light source, wherein the method comprises following steps:

step S10, providing a substrate where a first pad and a second pad disposed spaced apart from each other, a first connected area disposed on the first pad, a second connected area disposed on the second pad, and forming a plurality of pad holes in both the first connected area and the second connected area respectively by an etching process;

step S20, filling magnetic materials into the plurality of pad holes to form a magnetic film layer;

step S30, applying a solder paste on both the first connected area and the second connected area;

step S40, soldering a plurality of pins disposed on two sides of the light-emitting diode chip to the first connected area and the second connected area respectively, wherein the magnetic film layer is configured to absorb the plurality of pins to fix the light-emitting diode chip.

10. The welding method as claimed in the claim 9, wherein a size of each of the plurality of the pad hole is 20% to 80% of an area of a corresponding area of the plurality of pins, and a height of the magnetic film layer is equal to a depth of the pad hole.

* * * * *